US005140382A

United States Patent [19]

Shiga

[11] Patent Number: 5,140,382

[45] Date of Patent: Aug. 18, 1992

[54] MICROWAVE INTEGRATED CIRCUIT USING A DISTRIBUTED LINE WITH A VARIABLE EFFECTIVE LENGTH

[75] Inventor: Nobuo Shiga, Yokohama, Japan

[73] Assignee: Sumitomo Electric Industries, Ltd., Japan

[21] Appl. No.: 685,162

[22] Filed: Apr. 12, 1991

Related U.S. Application Data

[63] Continuation of Ser. No. 472,246, Jan. 30, 1990, abandoned.

[30] Foreign Application Priority Data

Feb. 17, 1989 [JP] Japan .................................. 1-36245

[51] Int. Cl.[5] ........................ H01L 29/48; H03B 5/12; H01P 1/18

[52] U.S. Cl. ........................................ 357/15; 357/68; 357/71; 331/107 SL; 333/161; 333/164

[58] Field of Search ............................ 357/15, 68, 71; 331/107 SL; 333/161, 164

[56] References Cited

U.S. PATENT DOCUMENTS

| | | | |
|---|---|---|---|
| 4,185,252 | 1/1980 | Gerlach | 331/167 SL |
| 4,275,366 | 6/1981 | Schwarzmann | 333/161 |
| 4,463,366 | 7/1984 | Ishii et al. | 357/15 |
| 4,626,807 | 12/1986 | Wilson | 333/161 |
| 4,697,162 | 9/1987 | Kameya | 333/161 |
| 4,721,985 | 1/1988 | Pavlidis et al. | 357/15 |
| 4,724,220 | 2/1988 | Calviello | 357/15 |
| 4,807,022 | 2/1989 | Kazior et al. | 357/15 |
| 4,829,173 | 5/1989 | Ditchek et al. | 357/15 |
| 4,833,095 | 5/1989 | Calviello | 357/15 |
| 4,837,532 | 6/1989 | Lang | 333/161 |
| 4,914,407 | 4/1990 | Itoh | 333/161 |

FOREIGN PATENT DOCUMENTS

| | | | |
|---|---|---|---|
| 55-90101 | 7/1980 | Japan | 333/164 |
| 58-136106 | 8/1983 | Japan | 333/164 |

OTHER PUBLICATIONS

Okamura, S. et al., "Electrically Controllable Microwave Phase Shifter Using Schottky Varactor Diode", Rep. Univ. Electro. Commun. (Japan), vol. 28, No. 1, Aug. 1977, pp. 15-19.

*Primary Examiner*—Edward J. Wojciechowicz
*Attorney, Agent, or Firm*—Beveridge, DeGrandi & Weilacher

[57] ABSTRACT

In this invention, a distributed constant line on a microwave IC is formed of a Schottky metal, and a semiconductor conductive layer contacting the distributed constant line at least at one position and an ohmic contact electrode contacting the semiconductor conductive layer are arranged. According to this invention, characteristics of ICs can be optimized against a variation in elements combined with a circuit comprising the distributed constant line after the manufacture of ICs.

5 Claims, 1 Drawing Sheet

MICROWAVE INTEGRATED CIRCUIT USING A DISTRIBUTED LINE WITH A VARIABLE EFFECTIVE LENGTH

This application is a continuation of application Ser. No. 07/472,246, filed Jan. 30, 1990 now abandoned.

BACKGROUND OF THE INVENTION

1. Field of the Invention

The present invention relates to a microwave integrated circuit (IC) used for processing a microwave or millimeter wave signal having a very high frequency of several GHz or higher.

2. Description of the Related Art

Recently, along with the rapid progression of IC techniques, microwave ICs tend to hold an important place in microwave circuits. In such a microwave IC, a circuit having a function of impedance conversion or filtering is constituted by a distributed constant line such as a microstrip line obtained by adhering a metal thin film on a semiconductor substrate.

In the conventional microwave IC, it is convenient if characteristics of the distributed constant line can be externally and electrically adjusted after the manufacture of an IC.

For example, in order to obtain a maximum gain in an IC constituting an amplifier, it is necessary to add an impedance matching circuit for impedance-converting a characteristic impedance (50 106 ) of an externally connected microstrip line into a conjugate complex $S_{11}^*$ of an S parameter $S_{11}$ of an amplification FET. However, FETs suffer from variations in manufacture, and hence, the S parameter also varies. Therefore, a standardized matching circuit cannot realize designed performance. The same also applies to an output matching circuit.

SUMMARY OF THE INVENTION

It is an object of the present invention to provide a microwave IC wherein a line formed of a Schottky metal is formed as a distributed constant line, and a semiconductor conductive layer contacting the Schottky metal line and an ohmic metal electrode contacting the semiconductor conductive layer are arranged.

In a microwave IC, a distributed constant line is formed by depositing or plating a metal thin film on a semiconductor substrate, and its film thickness is about 1 to 10 μm. The electrical characteristics of the distributed constant line are mainly determined by the frequency of a signal to be processed, and the width and length of the line itself.

In the present invention, a Schottky diode is formed between a Schottky metal line and a semiconductor conductive layer. If the semiconductor conductive layer is assumed to have an n conductivity type, when a DC potential of the semiconductor conductive layer is lower than that of line, a forward-biased current flows from the line side toward the semiconductor conductive layer side. Otherwise, no current flows. Therefore, the effective length of the distributed constant line can be changed by a DC potential externally applied to the semiconductor conductive layer through the ohmic metal electrode.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 1:
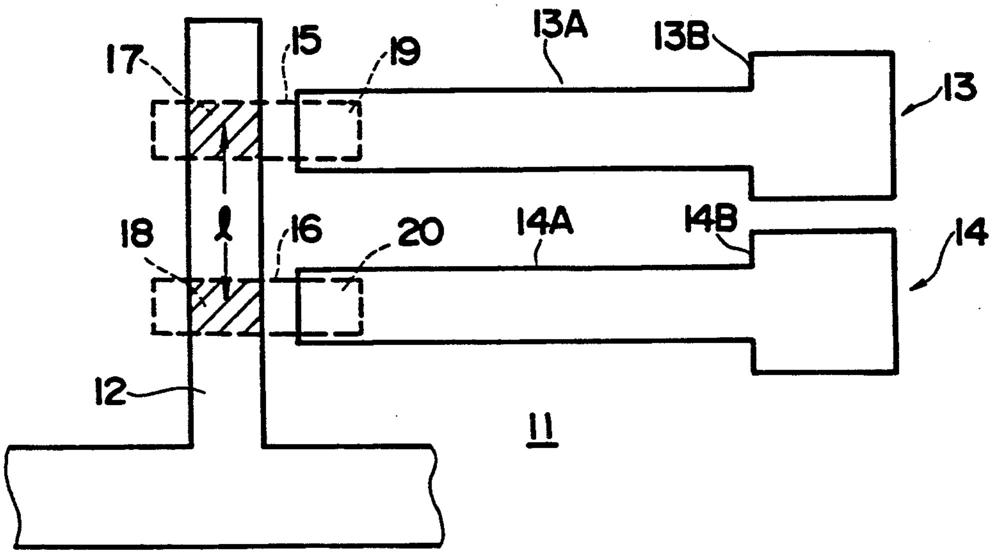
FIG. 1 is a plan view showing an embodiment of the present invention.

Length control of a short (short-circuiting) stub will be explained below with reference to FIG. 1. A Schottky metal line 12 and ohmic metal electrodes 13 and 14 are formed on a semiconductor substrate 11. Semiconductor conductive layers 15 and 16 are formed on a surface portion of the semiconductor substrate 11. The semiconductor conductive layers 15 and 16 are formed such that their one-end portions contact the Schottky metal line 12 and their other-end portions contact the ohmic metal electrodes 13 and 14. Schottky diodes are formed at regions 17 and 18 where the Schottky metal line 12 overlap the semiconductor conductive layers 15 and 16, and ohmic contacts are formed at regions 19 and 20 where the ohmic metal electrodes 13 and 14 overlap the semiconductor conductive layers 15 and 16. Note that the ohmic metal electrodes 13 and 14 respectively comprise lead portions 13A and 14A and pad portions 13B and 14B.

In this embodiment, GaAs is used as a material of the semiconductor substrate 11. The semiconductor conductive layers 15 and 16 have an n conductivity type by doping Si ions in the substrate 11. The Schottky metal line 12 has a three-layered structure of Ti/Pt/Au, and the ohmic metal electrodes 13 and 14 has a two-layered structure of AuGe/Ni.

Since the conductive layers 15 and 16 have the n conductivity type, a short-circuit portion of a short stub constituted by the Schottky metal line 12 changes in a case (1) wherein a DC potential lower than that of the Schottky metal line 12 is applied to the pad portion 14B and in a case (2) wherein the DC potential of the pad portion 14B is set to be higher than that of the Schottky metal line 12, and instead, a DC potential lower than that of the Schottky metal line 12 is applied to the pad portion 13B. In the case (1), an effective length as the short stub is decreased by as compared to that in the case (2).

More specifically, in the case (1), a short stub extending from the region 18 to the ohmic metal electrode 14 via the semiconductor conductive layer 16 is formed. In the case (2), a short stub extending from the region 17 to the ohmic metal electrode 13 via the semiconductor conductive layer 15 is formed.

Therefore, a line of a portion which will require adjustment later is formed by the Schottky metal line beforehand, and is connected to the ohmic metal electrode through the semiconductor conductive layer. Thus, the characteristics of the line can be externally adjusted by increasing/decreasing a DC potential applied to the semiconductor conductive layer through the ohmic metal electrode after the manufacture of an IC.

When DC potentials to be applied to the pad portions 13B and 14B are set to be higher than that of the Schottky metal line 12, an open stub can be formed.

In the above embodiment, when three or more sets of the semiconductor conductive layers 15 and 16 and the ohmic metal electrodes 13 and 14 are formed, the length of the short stub can be changed in three or more steps.

Note that DC components and high-frequency signal components can be discriminated from each other, and a DC potential set to adjust the length of the line does not adversely influence signals.

Materials used in the above embodiment are merely examples, and the present invention is no limited to this.

For example, as a material of the substrate, InP may be employed. Ions to be doped to form an n-type semiconductor conductive layer in a GaAs substrate include Se, Sn, Te, and the like in addition to Si.

Figure 2:
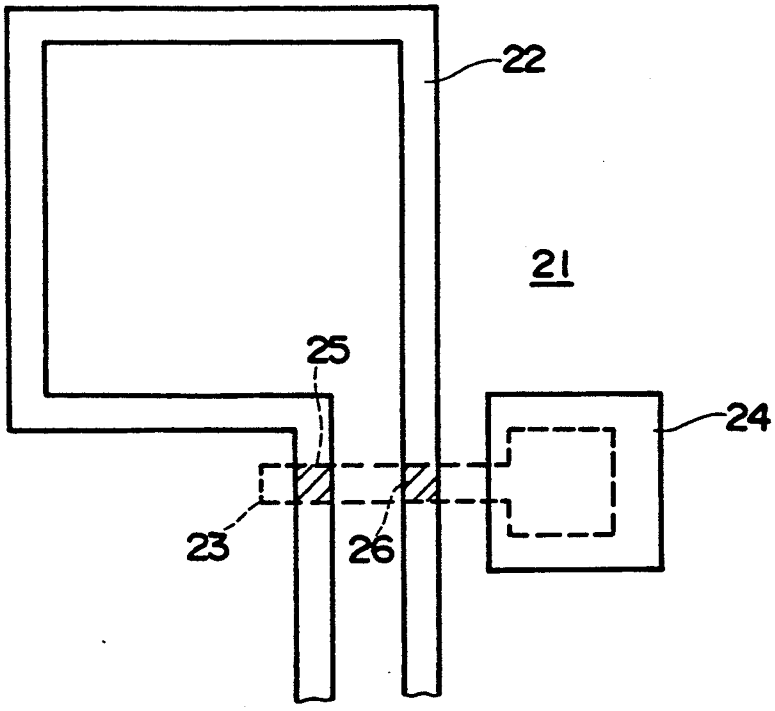
FIG. 2 is a plan view showing another embodiment of the present invention.

FIG. 2 is a plan view showing another embodiment of the present invention. In this embodiment, a semiconductor conductive layer 23 is formed to cross a Schottky metal line 22 formed on a semiconductor substrate 21 at two positions, and is connected to an ohmic metal electrode 24. In this case, Schottky diodes are also formed on regions 25 and 26. Thus, the length of a line can be adjusted by setting a higher or lower DC potential to be applied from the ohmic metal electrode 24 to the semiconductor conductive layer 23 than that of the Schottky metal line 22.

More specifically, when the DC potential to be applied to the ohmic metal electrode 24 is set to be lower than that of the Schottky metal line 22, the Schottky metal line 22 and the semiconductor conductive layer 23 are electrically connected to each other on both the regions 25 and 26. For this reason, a new line for effectively short-circuiting the regions 25 and 26 is formed.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A microwave integrated circuit comprising:

a first Schottky metal line portion extending in a first direction and functioning as a distributed constant line;

a stub portion extending from said first line portion in a second direction different from said first direction, said stub portion functioning as a stub in said microwave circuit, and said stub portion comprising a Schottky metal portion formed on a semiconductor substrate;

a conductive strip made of semiconductive material, said conductive strip being in electrical contact with said Schottky metal portion of said stub portion at a predetermined position to make a Schottky contact therewith; and an ohmic metal electrode formed on said substrate, said ohmic metal electrode being in contact with said conductive strip to make an ohmic contact between said ohmic metal electrode and said conductive strip; and a conductive state between said conductive strip and said stub portion at said predetermined position being switched over when a predetermined potential is applied to said ohmic metal electrode, whereby an electrical length of said stub portion as a stub is changed in said microwave circuit.

2. A microwave integrated circuit according to claim 1, wherein when said predetermined potential is applied to said ohmic electrode, the function of said stub portion as a stub in the microwave integrated circuit is changed

3. a microwave integrated circuit according to claim 1, wherein at least two pairs of said semiconductor conductive layers and said ohmic metal electrodes are provided.

4. a microwave integrated circuit according to claim 1, wherein one semiconductor layer contacts with said another Schottky metal line portion at two positions thereon thereof.

5. A microwave integrated circuit according to claim 1, wherein said first Schottky metal line is continuous at a position where said stub portion extends therefrom.

* * * * *